(12) United States Patent
Wang et al.

(10) Patent No.: US 12,185,610 B2
(45) Date of Patent: Dec. 31, 2024

(54) OLED DISPLAY PANEL AND DISPLAY APPARATUS WITH FIRST AND SECOND METAL MESH LAYERS

(71) Applicants: Chengdu BOE Optoelectronics Technology Co., Ltd., Sichuan (CN); BOE TECHNOLOGY GROUP CO., LTD., Beijing (CN)

(72) Inventors: Jiangsheng Wang, Beijing (CN); Shimin Pu, Beijing (CN); Wenhong Liu, Beijing (CN); Qi Liu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 17/770,667

(22) PCT Filed: Jun. 17, 2021

(86) PCT No.: PCT/CN2021/100521
§ 371 (c)(1),
(2) Date: Apr. 21, 2022

(87) PCT Pub. No.: WO2021/254420
PCT Pub. Date: Dec. 23, 2021

(65) Prior Publication Data
US 2022/0375998 A1   Nov. 24, 2022

(30) Foreign Application Priority Data
Jun. 18, 2020 (CN) .......................... 202010559945.2

(51) Int. Cl.
*H10K 59/40* (2023.01)
*G06F 3/044* (2006.01)
*H10K 71/00* (2023.01)

(52) U.S. Cl.
CPC ........... *H10K 59/40* (2023.02); *G06F 3/0446* (2019.05); *H10K 71/00* (2023.02);
(Continued)

(58) Field of Classification Search
CPC ................... G06F 3/044; G06F 3/0443; G06F 3/0445–0448; G06F 2203/04103;
(Continued)

(56) References Cited

U.S. PATENT DOCUMENTS

2014/0176821 A1* 6/2014 Chae ....................... G06F 3/041
427/79
2015/0054803 A1* 2/2015 Yashiro ................ G09G 3/3648
345/206

(Continued)

FOREIGN PATENT DOCUMENTS

CN  107092400 A  8/2017
CN  108681414 A  10/2018

(Continued)

OTHER PUBLICATIONS

China Patent Office, CN202010559945.2, First Office Action issued on Mar. 1, 2023.

*Primary Examiner* — Keith L Crawley
(74) *Attorney, Agent, or Firm* — HOUTTEMAN LAW LLC

(57) ABSTRACT

The present application discloses an OLED display panel and a display apparatus. The OLED display panel includes an OLED layer and a touch panel layer on the OLED layer, the touch panel layer includes a first metal mesh layer, an insulation layer is provided on a side of the first metal mesh
(Continued)

layer close to the OLED layer, and a second metal mesh layer and a bridge metal layer are provided on a side of the insulation layer close to the OLED layer, the bridge metal layer and the second metal mesh layer are arranged in a same layer and insulated from each other, and the bridge metal layer is connected to the first metal mesh layer through a via penetrating through the insulation layer.

15 Claims, 2 Drawing Sheets

(52) U.S. Cl.
CPC .............. *G06F 2203/04103* (2013.01); *G06F 2203/04111* (2013.01); *G06F 2203/04112* (2013.01)

(58) Field of Classification Search
CPC . G06F 2203/04107; G06F 2203/04111; G06F 2203/04112; H10K 59/126; H10K 59/40; H10K 71/00
See application file for complete search history.

(56) References Cited

U.S. PATENT DOCUMENTS

| | | | |
|---|---|---|---|
| 2016/0274398 A1* | 9/2016 | Hirakata | G06F 3/0443 |
| 2018/0129352 A1* | 5/2018 | Kim | G06F 3/0446 |
| 2018/0253175 A1 | 9/2018 | Yao | |
| 2019/0204952 A1* | 7/2019 | Han | G06F 3/0416 |
| 2019/0377457 A1* | 12/2019 | Nakayama | G06F 3/0445 |
| 2020/0026377 A1* | 1/2020 | Gwon | G06F 3/04182 |
| 2020/0026393 A1* | 1/2020 | Gourevitch | G06F 3/04164 |
| 2020/0089355 A1* | 3/2020 | Moon | G06F 3/0412 |
| 2020/0183538 A1* | 6/2020 | Li | G06F 3/0446 |
| 2021/0173524 A1* | 6/2021 | Deng | G06F 3/0443 |

FOREIGN PATENT DOCUMENTS

| | | |
|---|---|---|
| CN | 109669572 A | 4/2019 |
| CN | 109992160 A | 7/2019 |
| CN | 111708458 A | 9/2020 |
| CN | 112114702 A | 12/2020 |

* cited by examiner

OLED DISPLAY PANEL AND DISPLAY APPARATUS WITH FIRST AND SECOND METAL MESH LAYERS

The present application claims priority from Chinese patent application No. 202010559945.2 filed on Jun. 18, 2020, the entirety of which is incorporated herein by reference.

TECHNICAL FIELD

The present disclosure relates to the field of flexible OLED technology, and in particular, relates to an OLED display panel and a display apparatus.

BACKGROUND

With the development of technology, organic light-emitting diodes (OLEDs) have occupied the middle-to-high-end market of mobile phones due to its advantages of high color gamut, low power consumption, and the like. According to characteristics of products, OLEDs may be classified into rigid OLEDs and flexible OLEDs, and the flexible OLEDs are widely studied because of their capability of being manufactured into curved, folded, and curled products.

Based on the technology of touch panel, flexible OLED products may be divided into three major types: out-cell, on-cell (FMLOC, flexible multi-layer on cell) and in-cell. The out-cell type involves a lower process difficulty, but FMLOC gradually becomes the mainstream of screens of high-end AMOLED mobile phones in the market due to its advantages of thinner structure, narrower bezel, better optical effect and the like.

In the existing art, FMLOC has the following disadvantages: 1. a relatively low signal-to-noise ratio, where since a touch electrode is directly evaporated on a surface of an encapsulation layer of the OLED, a distance between the touch electrode and the OLED is shortened, which may cause serious crosstalk of OLED signals and influence signal receipt of the touch electrode, resulting in a significantly increased influence of noise on the touch panel, and finally resulting in a relatively low signal-to-noise ratio; 2. excessive RC loading, where since the distance between the touch electrode and the OLED is shortened, a relatively large parasitic capacitance is formed between the OLED panel and the touch panel, resulting in excessive resistive-capacitive loading (RC loading), which severely affects a charging time of the touch panel. For a relatively large-sized panel, an impedance of the touch electrode is relatively higher, and the above two disadvantages of FMLOC may affect touch performance.

SUMMARY

In a first aspect, an embodiment of the present disclosure provides an OLED display panel, including an OLED layer and a touch panel layer on the OLED layer, where the touch panel layer includes a first metal mesh layer, an insulation layer is provided on a side of the first metal mesh layer close to the OLED layer, and a second metal mesh layer and a bridge metal layer are provided on a side of the insulation layer close to the OLED layer; and the bridge metal layer and the second metal mesh layer are arranged in a same layer and insulated from each other, and the bridge metal layer is connected to the first metal mesh layer through a via penetrating through the insulation layer.

In some implementations, the first metal mesh layer, the second metal mesh layer, and the bridge metal layer each have a mesh structure, and the first metal mesh layer, the second metal mesh layer, and the bridge metal layer have a same mesh density.

In some implementations, an orthographic projection of the second metal mesh layer on the OLED layer at least partially covers an orthographic projection of the first metal mesh layer on the OLED layer.

In some implementations, the second metal mesh layer and the bridge metal layer are made of a same material.

In some implementations, the first metal mesh layer includes a plurality of driving electrodes and a plurality of sensing electrodes, the driving electrodes intersect with and are insulated from the sensing electrodes, and at intersections at which the driving electrodes intersect with the sensing electrodes, sub-electrodes of each of the driving electrodes or the sensing electrodes are connected with each other through the bridge metal layer.

In some implementations, each of the driving electrodes and each of the sensing electrodes are respectively provided with dummies, and the dummies are insulated from the driving electrodes and the sensing electrodes, and are disposed in the same layer as the driving electrodes and the sensing electrodes.

In some implementations, the touch panel layer further includes an organic layer on a side of the first metal mesh layer away from the OLED layer.

In some implementations, a buffer layer is provided between the OLED layer and the second metal mesh layer.

In some implementations, the second metal mesh layer is configured to be connected to a level signal supply terminal.

In a second aspect, an embodiment of the present disclosure provides a display apparatus, including the OLED display panel as described above.

In a third aspect, an embodiment of the present disclosure provides a method for preparing an OLED display panel, including:

forming an OLED layer;

forming a second metal mesh layer and a bridge metal layer on a side of the OLED layer so that the second metal mesh layer and the bridge metal layer are in a same layer and insulated from each other;

forming an insulation layer on a side of the second metal mesh layer and the bridge metal layer away from the OLED layer; and forming a first metal mesh layer on a side of the insulation layer away from the OLED layer, where the bridge metal layer is connected to the first metal mesh layer through a via penetrating through the insulation layer.

In some implementations, the first metal mesh layer, the second metal mesh layer, and the bridge metal layer are each formed as a mesh structure with a same mesh density.

In some implementations, the second metal mesh layer and the first metal mesh layer are formed such that an orthographic projection of the second metal mesh layer on the OLED layer at least partially covers an orthographic projection of the first metal mesh layer on the OLED layer.

In some implementations, the second metal mesh layer and the bridge metal layer are formed by a same material in a single patterning process.

In some implementations, the first metal mesh layer is formed to include a plurality of driving electrodes and a plurality of sensing electrodes, the driving electrode intersect with and are insulated from the sensing electrodes, and at intersections at which the driving electrodes intersect with the sensing electrodes, sub-electrodes of each of the driving electrodes or the sensing electrodes are formed to be connected with each other through the bridge metal layer.

In some implementations, the first metal mesh layer includes a plurality of driving electrodes and a plurality of sensing electrodes, and the method further includes:

forming dummies in the same layer as the first metal mesh layer, where the dummies are insulated from the driving electrodes and the sensing electrodes.

In some implementations, the method for preparing an OLED display panel further includes:

forming an organic layer on a side of the first metal mesh layer away from the OLED layer.

In some implementations, the method for preparing an OLED display panel further includes:

forming a buffer layer between the OLED layer and the second metal mesh layer.

In some implementations, the second metal mesh layer is formed to be connectable to a level signal supply terminal.

BRIEF DESCRIPTION OF DRAWINGS

Other features, objects and advantages of the present application will become more apparent upon reading the detailed description of non-limiting embodiments made with reference to the following drawings, in which.

DETAIL DESCRIPTION OF EMBODIMENTS

Figure 1:
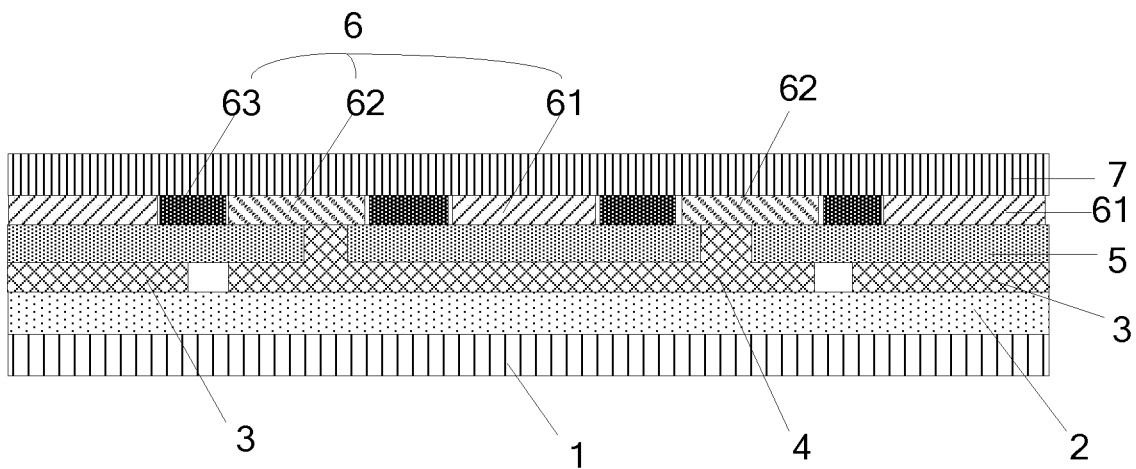
FIG. 1 is a schematic diagram showing a sectional structure of an OLED display panel according to an embodiment of the present disclosure.

The present disclosure will be further described in detail below in conjunction with the drawings and exemplary embodiments. It will be appreciated that the specific embodiments described here are used only for the purpose of explaining the present disclosure instead of limiting the present disclosure. It should be also noted that, for the convenience of description, only parts related to the present disclosure are shown in the drawings.

It should be noted that the embodiments of the present disclosure and features therein may be combined with each other, as long as they are not contradictory. The present disclosure will be described in detail below with reference to the drawings in conjunction with the embodiments.

Unless otherwise defined, technical or scientific terms used in the embodiments of the present disclosure are intended to have general meanings as understood by those of ordinary skill in the art. The words "first", "second" and similar terms used in the embodiments of the present disclosure do not denote any order, quantity, or importance, but are used merely for distinguishing different components from each other. Also, the use of the terms "a", "an", or "the" and similar referents do not denote a limitation of quantity, but rather denote the presence of at least one element. The word "comprising", "including" or the like means that the element or item preceding the word contains elements or items that appear after the word or equivalents thereof, but does not exclude other elements or items. The term "connected", "coupled" or the like is not restricted to physical or mechanical connections, but may include electrical connections, whether direct or indirect.

Referring to FIG. 1, an embodiment of the present disclosure provides an OLED display panel, including an OLED layer 1 and a touch panel layer on the OLED layer 1. The touch panel layer includes an organic layer 7, and a first metal mesh layer 6 is provided on a side of the organic layer 7 close to the OLED layer 1.

An insulation layer 5 is provided on a side of the first metal mesh layer 6 close to the OLED layer 1, a second metal mesh layer 3 is provided on a side of the insulation layer 5 close to the OLED layer 1, and a buffer layer 2 is provided between the OLED layer 1 and the second metal mesh layer 3.

The second metal mesh layer 3 may be connected to a touch chip.

In the embodiment, the second metal mesh layer 3 is further provided between the insulation layer 5 and the buffer layer 2, and may be connected to the touch chip through a peripheral lead. With the second metal mesh layer 3 shielding noise of the display panel, loading on the touch panel layer is further reduced, thereby reducing the noise of the display panel, and improving the signal-to-noise ratio of touch control. Meanwhile, a signal may be sent to the second metal mesh layer 3 through the touch chip so that the second metal mesh layer 3 is not electrically interfered by the OLED layer 1, thereby shielding the noise of the display panel.

The first metal mesh layer 6 and the second metal mesh layer 3 each may have a mesh structure.

Additionally, in fact, the second metal mesh layer 3 may be connected to a level signal supply terminal.

In some implementations, an orthographic projection of the second metal mesh layer 3 on the OLED layer 1 at least partially covers an orthographic projection of the first metal mesh layer 6 on the OLED layer 1.

In the embodiment, by providing the second metal mesh layer 3, the noise of the display panel is shield, and the second metal mesh 3 should be disposed between the first metal mesh layer 6 and the OLED layer 1. In addition, sub-pixels are provided at positions corresponding to a part of meshes of the first metal mesh layer 6. In order to guarantee the effect of the second metal mesh layer 3 while avoiding an influence on the sub-pixels, the second metal mesh layer 3 is provided such that an orthographic projection of the second metal mesh layer 3 on the OLED layer 1 at least partially covers an orthographic projection of the first metal mesh layer 6 on the OLED layer 1, so as to guarantee shielding the noise of the display panel by the second metal mesh layer 3.

Figure 2:
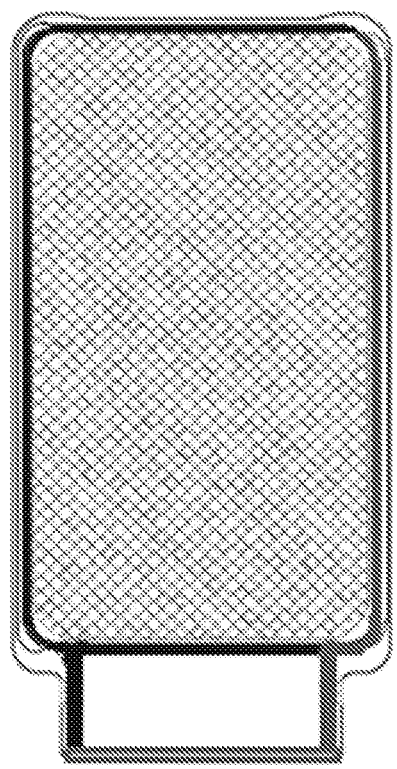
FIG. 2 is a schematic diagram of a second metal mesh layer of an OLED display panel according to an embodiment of the present disclosure.

In some implementations, the second metal mesh layer 3 has the same mesh density as the first metal mesh layer 6. As shown in FIG. 2, a schematic structural diagram of the second metal mesh layer 3 is given. In other words, the second metal mesh layer 3 has a mesh structure. In the embodiment, with the second metal mesh layer 3 having the same mesh density as the first metal mesh layer 6, generation of optical moire, as well as influence on the display performance of the display panel, can be avoided, and meanwhile, such two mesh layers having the same mesh density may be prepared with a same mask, which is convenient for preparation of the second metal mesh layer 3, while the process will not become too complicated.

In some implementations, the second metal mesh layer 3 includes a plurality of metal wires interlaced with each other.

The second metal mesh layer 3 in the embodiment includes interconnected metal wires, where metal wires are interconnected with each other and may be finally connected to the touch chip to shield the noise of the display panel.

In some implementations, a via is provided in the insulation layer 5, a bridge metal layer 4 is provided on a side of the insulation layer 5 close to the OLED layer 1, and the bridge metal layer 4 is connected to the first metal mesh layer 6 through the via.

In the OLED display panel of the embodiment, a via is provided in the insulation layer 5, a bridge metal layer 4 is provided between the insulation layer 5 and the buffer layer 2, and the bridge metal layer 4 is connected to the first metal mesh layer 6.

In some implementations, as shown in FIG. 1, the bridge metal layer 4 is disposed in the same layer as the second metal mesh layer 3, and also has a mesh structure. The bridge metal layer 4 may have the same mesh density as the first metal mesh layer 6 and the second metal mesh layer 3.

In the embodiment, the second metal mesh layer 3 and the bridge metal layer 4 are disposed in a same layer. On one hand, the structure formed for preparing the bridge metal layer 4 is also enough for preparing the second metal mesh layer 3, so that the second metal mesh layer 3 and the bridge metal layer 4 can be prepared simultaneously, and the process will not be complicated when the bridge metal layer 4 and the second metal mesh layer 3 are prepared simultaneously. On the other hand, with the second metal mesh layer 3 and the bridge metal layer 4 being disposed in the same layer, the whole structure of the display panel would not be changed too much, and a thickness of the display panel or the like will not be changed significantly.

In some implementations, the second metal mesh layer 3 and the bridge metal layer 4 are insulated from each other.

In the embodiment, since the bridge metal layer 4 is connected to the first metal mesh layer 6, and the second metal mesh layer 3 is designed to shield noise of the display panel and may be connected to a driving chip (e.g., a touch chip), the second metal mesh layer 3 is insulated from the bridge metal layer 4, for example, the second metal mesh layer 3 may be prevented from contacting with the bridge metal layer 4.

In some implementations, the first metal mesh layer 6 has a plurality of driving electrodes arranged in parallel in a first direction (e.g., a vertical direction of the display panel) and a plurality of sensing electrodes arranged in parallel in a second direction (e.g., a horizontal direction of the display panel). The driving electrodes intersect with the sensing electrodes, and at intersections at which the driving electrodes intersect with the sensing electrodes, the driving electrodes are insulated from the sensing electrodes, and sub-electrodes of each of the driving electrodes or the sensing electrodes may be connected with each other through the bridge metal layer 4.

In the embodiment, as shown in FIG. 1, the case where the first metal mesh layer 6 has a plurality of sensing electrodes 61 and a plurality of driving electrodes 62, and sub-electrodes of each of the driving electrodes 62 are connected with each other through the bridge metal layer 4 is taken as an example for explanation, but the present disclosure is not limited thereto. In fact, the sensing electrodes 61 and the driving electrodes 62 are interchangeable.

In some implementations, in order to reduce loading on the driving electrodes, the driving electrodes may be driven in a bilateral driving mode, i.e., driven from two ends thereof. For example, drive signals may be input from both ends of each driving electrode to drive the driving electrode.

In some implementations, the first metal mesh layer 6 has a plurality of driving electrodes and a plurality of sensing electrodes, and each driving electrode and each sensing electrode are respectively provided therein with a plurality of dummies spaced apart from each other. The dummies are insulated from the driving electrodes and the sensing electrodes, and disposed in the same layer as the driving electrodes and the sensing electrodes.

As shown in FIG. 1, the OLED display panel of the embodiment includes an OLED layer 1 and a touch panel layer on the OLED layer 1. The touch panel layer includes a buffer layer 2 on the OLED layer 1. The buffer layer 2 may be made of tetrafluoroethylene (TFE). Then, the second metal mesh layer 3 and the bridge metal layer 4 are prepared on the buffer layer 2. The second metal mesh layer 3 and the bridge metal layer 4 are disposed in a same layer and may be prepared simultaneously, and the second metal mesh layer 3 and the bridge metal layer 4 are insulated from each other. For example, a dummy (i.e., floating electrode) may be disposed between the second metal mesh layer 3 and the bridge metal layer 4, where the dummy refers to a metal layer structure without any electrical signal, and is insulated from the second metal mesh layer 3 and the bridge metal layer 4. Then, the insulation layer 5 is provided on the second metal mesh layer 3 and the bridge metal layer 4, and the first metal mesh layer 6 is provided on the insulation layer 5. The insulation layer 5 is provided with a via through which the bridge metal layer 4 is connected to the first metal mesh layer 6. The first metal mesh layer 6 includes a plurality of driving electrodes Tx and a plurality of sensing electrodes Rx. The driving electrodes are insulated from the sensing electrodes, and a dummy may be provided therebetween. The dummy is a region without any electrical signal and does not contact with the driving electrodes or the sensing electrodes. With such arrangement, each metal mesh layer (including the first metal mesh layer 6 and the second metal mesh layer 3) can be prepared more easily and conveniently. Finally, the organic layer 7 is provided on the first metal mesh layer 6.

In the embodiment, by adding the second metal mesh layer 3 to the layer where the bridge metal layer 4 is located, the second metal mesh layer 3 may be connected to the touch chip through a peripheral circuit, and functions to reduce noise of the display panel as well as loading on the touch layer, thereby reducing the noise of the display panel, and improving the signal-to-noise ratio of touch control. In some implementations, the second metal mesh layer 3 and the first metal mesh layer 6 have a same distribution/mesh density, thereby avoiding optical moire and ensuring display performance of the display panel.

Figure 3:
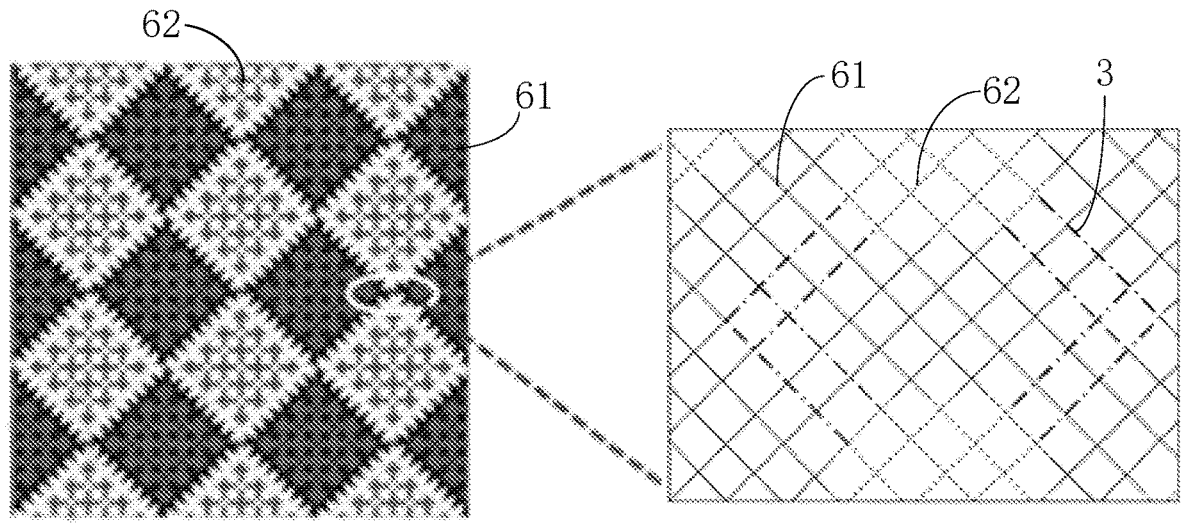
FIG. 3 shows a schematic relationship between a first metal mesh layer and a second metal mesh layer.

FIG. 3 shows a schematic relationship between a first metal mesh layer and a second metal mesh layer.

Taking the case where the first metal mesh layer 6 includes a plurality of sensing electrodes 61 and a plurality of driving electrodes 62, and sub-electrodes of each of the driving electrodes 62 are connected with each other through the bridge metal layer 4 as an example, as shown in left part of FIG. 3, the sensing electrodes 61 are arranged in parallel in the first direction, the driving electrodes 62 are arranged in parallel in the second direction, and the sensing electrodes 61 intersect with the driving electrodes 62.

The right part of FIG. 3 shows a schematic enlarged view of an intersection at which the sensing electrode 61 intersects with the driving electrode 62. As shown in the right part of FIG. 3, the sensing electrodes 61 and the driving electrodes 62 each have a mesh structure. The sensing electrodes 61 may be disposed in a same layer and connected. At the intersection at which the sensing electrode 61 intersects with the driving electrode 62, sub-electrodes of the driving electrode 62 are connected with each other through the bridge metal layer 4. The second metal mesh layer 3 and the bridge metal layer 4 are disposed in a same layer and insulated from each other. The bridge metal layer 4 also has a mesh structure, but is blocked in the figure.

An embodiment of the present disclosure further provides a display apparatus, including the OLED display panel as described above.

It will be appreciated that the display apparatus may further include other components, such as a power supply, or the like.

The display apparatus may be an electronic paper, a liquid crystal display panel, a mobile phone, a tablet, a television, a monitor, a laptop, a digital album, a navigator or any other product or component having a display function.

Figure 4:
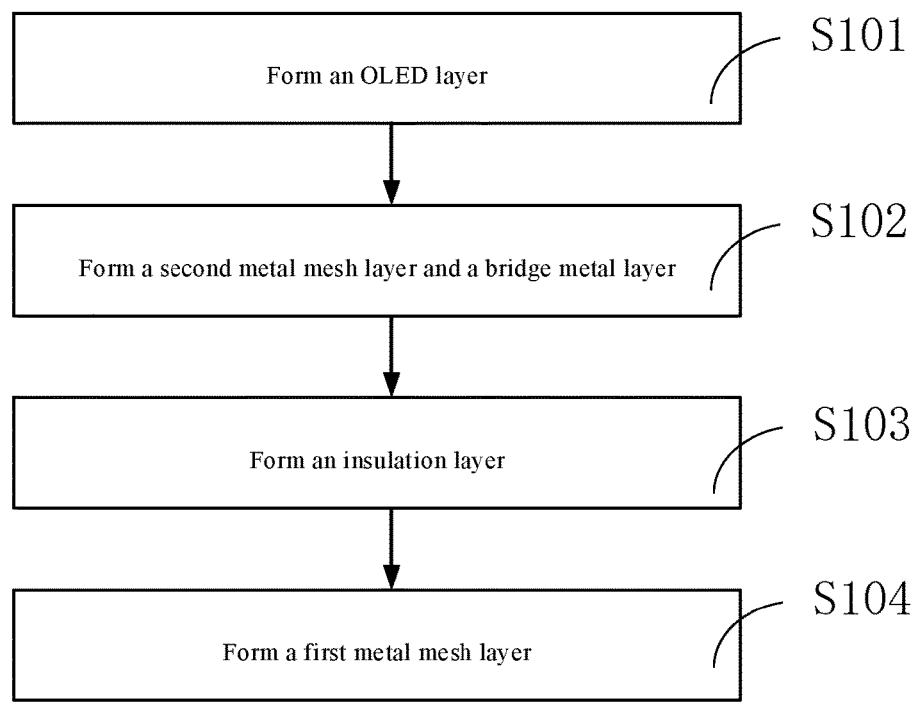
FIG. 4 shows a flowchart of a method for preparing an OLED display panel according to an embodiment of the present disclosure.

An embodiment of the present disclosure further provides a method for preparing an OLED display panel which, as shown in FIG. 4, includes the following steps S101 to S104.

At S101, forming an OLED layer.

At S102, forming a second metal mesh layer and a bridge metal layer on a side of the OLED layer so that the second metal mesh layer and the bridge metal layer are in a same layer and insulated from each other.

At S103, forming an insulation layer on a side of the second metal mesh layer and the bridge metal layer away from the OLED layer.

At S104, forming a first metal mesh layer on a side of the insulation layer away from the OLED layer, where the bridge metal layer is connected to the first metal mesh layer through a via penetrating through the insulation layer.

By forming the second metal mesh layer, noise of the display panel can be shielded, and loading on the touch panel can be reduced, thereby reducing the noise of the display panel, and improving the signal-to-noise ratio of touch control.

The first metal mesh layer, the second metal mesh layer, and the bridge metal layer each may be formed as a mesh structure with a same mesh density, so that generation of optical moire, as well as influence on the display performance of the display panel, can be avoided, and meanwhile, such mesh layers having the same mesh density can be prepared with a same mask, thereby the preparation is facilitated and a too complicated process is avoided.

In order to ensure the effect obtained by providing the second metal mesh layer, the second metal mesh layer and the first metal mesh layer may be formed such that an orthographic projection of the second metal mesh layer on the OLED layer at least partially covers an orthographic projection of the first metal mesh layer on the OLED layer, so as to guarantee shielding the noise of the display panel by the second metal mesh layer.

Since the second metal mesh layer and the bridge metal layer are disposed in the same layer and may be formed into mesh structures with the same mesh density, the second metal mesh layer and the bridge metal layer may be formed simultaneously by a same material in a single patterning process (including exposure, etching, development or the like), which will not complicate the process, will not change the whole structure of the display panel too much, and will not bring any significant change to a thickness of the display panel or the like.

Specifically, the first metal mesh layer may be formed to include a plurality of driving electrodes arranged in parallel in a first direction (e.g., a vertical direction of the display panel) and a plurality of sensing electrodes arranged in parallel in a second direction (e.g., a horizontal direction of the display panel). The driving electrodes intersect with and are insulated from the sensing electrodes, and at intersections at which the driving electrodes intersect with the sensing electrodes, sub-electrodes of each of the driving electrodes or the sensing electrodes are formed to be connected with each other through the bridge metal layer.

For example, the sensing electrodes may be formed in a same layer and connected, and at intersections at which the driving electrodes intersect with the sensing electrodes, sub-electrodes of each of the driving electrodes may be connected with each other through the bridge metal layer, but the present disclosure is not limited thereto, and in fact, it is also possible that the driving electrodes are formed in a same layer and connected, and sub-electrodes of each of the sensing electrodes are connected with each other through the bridge metal layer; a person skilled in the art can select as required.

In some implementations, the method for preparing an OLED display panel may further include:

forming dummies (i.e., floating electrodes) in the same layer as the first metal mesh layer, where the dummies are insulated from the driving electrodes and the sensing electrodes.

Specifically, each dummy is a metal layer structure without any electrical signal.

In some implementations, the method for preparing an OLED display panel may further include:

forming an organic layer on a side of the first metal mesh layer away from the OLED layer.

For example, the organic layer may be a protective layer.

In some implementations, the method for preparing an OLED display panel may further include:

forming a buffer layer between the OLED layer and the second metal mesh layer.

In addition, the second metal mesh layer may be formed to be connected to a level signal supply terminal. For example, the second metal mesh layer may be connected to a touch chip, through which a signal may be sent to the second metal mesh layer, so that the second metal mesh layer is not electrically interfered by the OLED layer, thereby shielding the noise of the display panel.

The above description illustrates merely exemplary embodiments of the present application and technical principles applied therein. It will be appreciated by those skilled in the art that the scope of the present disclosure is not limited to the technical solutions formed by specific combinations of the above technical features, but shall cover any other technical solution formed by any combination of the above technical features or equivalent features thereof without departing from the above concepts of the present disclosure, for example, technical solutions formed by replacing the disclosed technical features of the present disclosure with technical features having similar functions.

What is claimed is:

1. An OLED display panel, comprising an OLED layer and a touch panel layer on the OLED layer, wherein the touch panel layer comprises a first metal mesh layer,
   an insulation layer is provided on a side of the first metal mesh layer close to the OLED layer, and a second metal mesh layer and a bridge metal layer are provided on a side of the insulation layer close to the OLED layer; and
   the bridge metal layer and the second metal mesh layer are arranged in a same layer and insulated from each other, and the bridge metal layer is connected to the first metal mesh layer through a via penetrating through the insulation layer, wherein the second metal mesh layer is configured to be directly connected to a level signal supply terminal;

the first metal mesh layer comprises a plurality of driving electrodes and a plurality of sensing electrodes, the driving electrodes intersect with and are insulated from the sensing electrodes, and at intersections at which the driving electrodes intersect with the sensing electrodes, sub-electrodes of each of the driving electrodes or the sensing electrodes are connected with each other through the bridge metal layer;

a dummy insulated from the driving electrodes and the sensing electrodes is disposed between the driving electrodes and the sensing electrodes; and a dummy insulated from the second metal mesh layer and the bridge metal layer is disposed between the second metal mesh layer and the bridge metal layer.

2. The OLED display panel according to claim 1, wherein the first metal mesh layer, the second metal mesh layer, and the bridge metal layer each have a mesh structure, and the first metal mesh layer, the second metal mesh layer, and the bridge metal layer have a same mesh density.

3. The OLED display panel according to claim 1, wherein an orthographic projection of the second metal mesh layer on the OLED layer at least partially covers an orthographic projection of the first metal mesh layer on the OLED layer.

4. The OLED display panel according to claim 1, wherein the second metal mesh layer and the bridge metal layer are made of a same material.

5. The OLED display panel according to claim 1, wherein each driving electrode and each sensing electrode are respectively provided therein with dummies, and the dummies are insulated from the driving electrodes and the sensing electrodes, and disposed in the same layer as the driving electrodes and the sensing electrodes.

6. The OLED display panel according to claim 1, wherein the touch panel layer further comprises an organic layer on a side of the first metal mesh layer away from the OLED layer.

7. The OLED display panel according to claim 1, wherein a buffer layer is provided between the OLED layer and the second metal mesh layer.

8. A display apparatus, comprising the OLED display panel according to claim 1.

9. A method for preparing an OLED display panel, comprising:

forming an OLED layer;

forming a second metal mesh layer and a bridge metal layer on a side of the OLED layer so that the second metal mesh layer and the bridge metal layer are in a same layer and insulated from each other;

forming an insulation layer on a side of the second metal mesh layer and the bridge metal layer away from the OLED layer; and forming a first metal mesh layer on a side of the insulation layer away from the OLED layer, wherein the bridge metal layer is connected to the first metal mesh layer through a via penetrating through the insulation layer, wherein the second metal mesh layer is formed to be directly connected to a level signal supply terminal;

the first metal mesh layer comprises a plurality of driving electrodes and a plurality of sensing electrodes, the driving electrodes intersect with and are insulated from the sensing electrodes, and at intersections at which the driving electrodes intersect with the sensing electrodes, sub-electrodes of each of the driving electrodes or the sensing electrodes are connected with each other through the bridge metal layer;

a dummy insulated from the driving electrodes and the sensing electrodes is formed between the driving electrodes and the sensing electrodes; and a dummy insulated from the second metal mesh layer and the bridge metal layer is formed between the second metal mesh layer and the bridge metal layer.

10. The method according to claim 9, wherein the first metal mesh layer, the second metal mesh layer, and the bridge metal layer each are formed as a mesh structure, and have a same mesh density.

11. The method according to claim 9, wherein the second metal mesh layer and the first metal mesh layer are formed such that an orthographic projection of the second metal mesh layer on the OLED layer at least partially covers an orthographic projection of the first metal mesh layer on the OLED layer.

12. The method according to claim 9, wherein the second metal mesh layer and the bridge metal layer are formed of a same material in a single patterning process.

13. The method according to claim 9, wherein the first metal mesh layer comprises a plurality of driving electrodes and a plurality of sensing electrodes, and the method further comprises:

forming dummies in the same layer as the first metal mesh layer, wherein the dummies are insulated from the driving electrodes and the sensing electrodes.

14. The method according to claim 9, further comprising:

forming an organic layer on a side of the first metal mesh layer away from the OLED layer.

15. The method according to claim 9, further comprising:

forming a buffer layer between the OLED layer and the second metal mesh layer.

* * * * *